(12) United States Patent
Cheng et al.

(10) Patent No.: US 10,600,885 B2
(45) Date of Patent: Mar. 24, 2020

(54) VERTICAL FIN FIELD EFFECT TRANSISTOR DEVICES WITH SELF-ALIGNED SOURCE AND DRAIN JUNCTIONS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Choonghyun Lee, Rensselaer, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/105,442

(22) Filed: Aug. 20, 2018

(65) Prior Publication Data

US 2020/0058767 A1    Feb. 20, 2020

(51) Int. Cl.
| | |
|---|---|
| *H01L 29/66* | (2006.01) |
| *H01L 29/06* | (2006.01) |
| *H01L 29/08* | (2006.01) |
| *H01L 29/78* | (2006.01) |

(52) U.S. Cl.
CPC .... *H01L 29/66666* (2013.01); *H01L 29/0653* (2013.01); *H01L 29/0847* (2013.01); *H01L 29/66545* (2013.01); *H01L 29/66553* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,313,999 B2 | 11/2012 | Cappellani et al. | |
| 9,287,362 B1 | 3/2016 | Basu et al. | |
| 9,312,383 B1 | 4/2016 | Cheng et al. | |
| 9,530,866 B1 * | 12/2016 | Zhang | H01L 29/66666 |
| 9,583,489 B1 * | 2/2017 | Anderson | H01L 27/0921 |
| 9,685,409 B1 * | 6/2017 | Balakrishnan | H01L 29/66666 |
| 9,722,048 B1 * | 8/2017 | Balakrishnan | H01L 29/66666 |
| 9,761,728 B1 | 9/2017 | Cheng et al. | |
| 9,780,088 B1 * | 10/2017 | Balakrishnan | H01L 27/0629 |
| 9,799,765 B1 | 10/2017 | Bergendahl et al. | |
| 9,853,028 B1 | 12/2017 | Cheng et al. | |
| 9,954,109 B2 | 4/2018 | Cheng et al. | |

(Continued)

*Primary Examiner* — Bilkis Jahan
(74) *Attorney, Agent, or Firm* — Tutunjian & Bitetto, P.C.; Vazken Alexanian (57) ABSTRACT

A method of forming a fin field effect transistor device is provided. The method includes forming a plurality of vertical fins on a substrate. The method further includes forming a bottom source/drain layer adjacent to the plurality of vertical fins, and growing a doped layer on the bottom source/drain layer and sidewalls of the plurality of vertical fins. The method further includes forming a dummy gate liner on the doped layer and the bottom source/drain layer, and forming a dummy gate fill on the dummy gate liner. The method further includes forming a protective cap layer on the dummy gate fill, and removing a portion of the protective cap layer to expose a top surface of the plurality of vertical fins.

14 Claims, 10 Drawing Sheets

(56) References Cited

U.S. PATENT DOCUMENTS

| | | | |
|---|---|---|---|
| 2011/0253981 A1* | 10/2011 | Rooyackers | B82Y 10/00 257/24 |
| 2016/0056156 A1* | 2/2016 | Ghani | H01L 27/0886 257/401 |
| 2018/0151693 A1* | 5/2018 | Li | H01L 21/2022 |

* cited by examiner

VERTICAL FIN FIELD EFFECT TRANSISTOR DEVICES WITH SELF-ALIGNED SOURCE AND DRAIN JUNCTIONS

BACKGROUND

Technical Field

The present invention generally relates to field effect transistor devices, and more particularly to vertical transport fin field effect transistor devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a fin field effect transistor device is provided. The method includes forming a plurality of vertical fins on a substrate. The method further includes forming a bottom source/drain layer adjacent to the plurality of vertical fins, and growing a doped layer on the bottom source/drain layer and sidewalls of the plurality of vertical fins. The method further includes forming a dummy gate liner on the doped layer and the bottom source/drain layer, and forming a dummy gate fill on the dummy gate liner. The method further includes forming a protective cap layer on the dummy gate fill, and removing a portion of the protective cap layer to expose a top surface of the plurality of vertical fins.

In accordance with another embodiment of the present invention, a method of forming a fin field effect transistor device is provided. The method includes growing a doped layer on a bottom source/drain layer and sidewalls of a vertical fin on a substrate. The method further includes forming a bottom spacer layer on a portion of the doped layer. The method further includes forming a dummy gate liner on the bottom spacer layer and the doped layer. The method further includes forming a dummy gate fill on the dummy gate liner. The method further includes forming a protective cap layer on the dummy gate fill. The method further includes removing a portion of the protective cap layer to expose a top surface of the vertical fin. The method further includes removing a portion of the protective cap layer to form a protective spacer.

In accordance with yet another embodiment of the present invention, a fin field effect transistor device is provided. The fin field effect transistor device includes a vertical fin on a supporting pillar, wherein the supporting pillar is on a substrate. The fin field effect transistor device further includes a bottom source/drain layer adjacent to the supporting pillar, and a lower doped layer segment on the bottom source/drain layer and a lower section of the vertical fin. The fin field effect transistor device further includes a bottom spacer layer on the doped layer, and an upper doped layer segment on an upper section of the vertical fin. The fin field effect transistor device further includes a gate dielectric layer on the bottom spacer layer, lower doped layer segment, sidewalls of the vertical fin, and upper doped layer segment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide self-aligned source/drain junctions with controlled positioning of the top and bottom edges of the gate structure. The device structure can have a self-aligned gate-to-source/drain overlap junction using upper doped layer segments and lower doped layer segments that can define the edges of a gate structure relative to a gate-to-source/drain overlap junction.

Embodiments of the present invention provide a method of forming self-aligned source/drain junctions using a doped layer on portions of a vertical fin, and controlled removal of portions of the doped layer to form upper and lower cavities adjacent to the portion of the vertical fin forming the device channel. A method for forming vertical FET can include using a semi-sacrificial doped layer (sheath) to ensure self-aligned gate-to-source/drain overlap junction.

In various embodiments, a heat treatment can be used to diffuse dopants from portions of the doped layer into the adjacent vertical fin to control the position of the source/drain junctions.

Exemplary applications/uses to which the present invention can be applied include, but are not limited to: logic devices (e.g., NAND gate circuits, NOR gate circuits, inverters, etc.) and memory devices (e.g., static random access memory (SRAM), dynamic access memory (DRAM).

It is to be understood that aspects of the present invention will be described in terms of a given illustrative architecture; however, other architectures, structures, substrate materials and process features and steps can be varied within the scope of aspects of the present invention.

Figure 1:
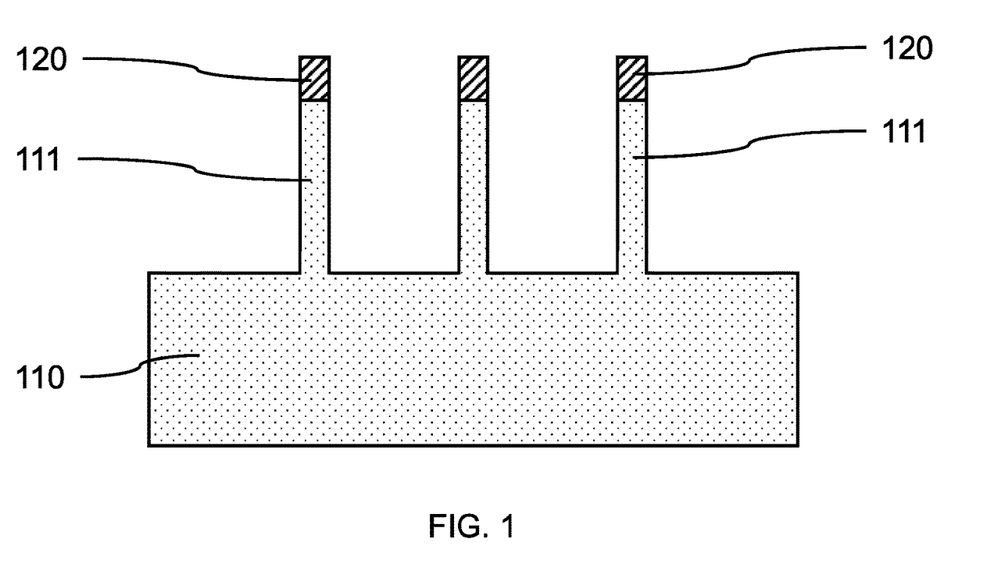
FIG. 1 is a cross-sectional side view showing a plurality of vertical fins formed on a substrate with a fin template on each of the vertical fins, in accordance with an embodiment of the present invention.

Referring now to the drawings in which like numerals represent the same or similar elements and initially to FIG. 1, a plurality of vertical fins formed on a substrate with a fin template on each of the vertical fins is shown, in accordance with an embodiment of the present invention.

In one or more embodiments, one or more vertical fins 111 can be formed on a substrate 110. The vertical fins 111 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 111 may be formed by a direct write process or double patterning process using, for example, immersion lithography, extreme ultraviolet lithography, or x-ray lithography. A fin template 120 can be formed on each of the vertical fins as part of the patterning process, where the fin templates 120 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In one or more embodiments, vertical fins 111 can be laterally adjacent to each other (i.e., in a row). The facing sidewalls of adjacent vertical fins 111 can be separated by a distance in a range of about 10 nanometers (nm) to about 50 nm, or in a range of about 20 nm to about 40 nm, although other distances are also contemplated. While the embodiments are described as vertical fins, the description and claims also encompass vertical nanowires and vertical pillar structures.

In various embodiments, the height of the semiconductor vertical fin(s) 111 can be in a range of about 20 nanometers (nm) to about 100 nm, or about 30 nm to about 50 nm, although other heights are also contemplated. Although the vertical fins 111 are depicted in the figures perpendicular to the substrate 110 (i.e., having a 90 degree angle), the fins can have a tapered sidewall that does not meet the substrate at a right angle (i.e., not exactly 90 degree). The top surface of the substrate 110 may not be perfectly flat between adjacent fins. The substrate surface can have a curved (recessed) profile.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)).

Figure 2:
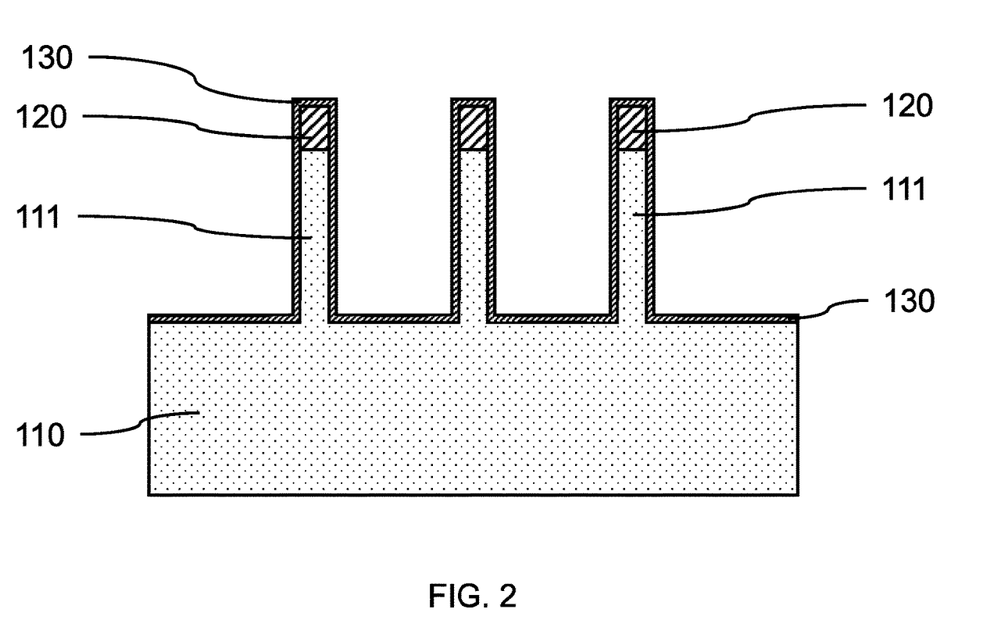
FIG. 2 is a cross-sectional side view showing a protective layer on the plurality of vertical fins and fin templates, in accordance with an embodiment of the present invention.

FIG. 2 is a cross-sectional side view showing a protective layer on the plurality of vertical fins and fin templates, in accordance with an embodiment of the present invention.

In one or more embodiments, a protective layer 130 can be formed on the substrate surface, a plurality of vertical fins 111, and the fin templates 120, where the protective layer 130 can be formed by a conformal deposition, for example, atomic layer deposition (ALD), plasma enhanced ALD (PEALD), or combinations thereof.

In various embodiments, the protective layer 130 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The protective layer 130 can be a different material from the fin templates 120, so the protective layer 130 can be selectively etched.

Figure 3:
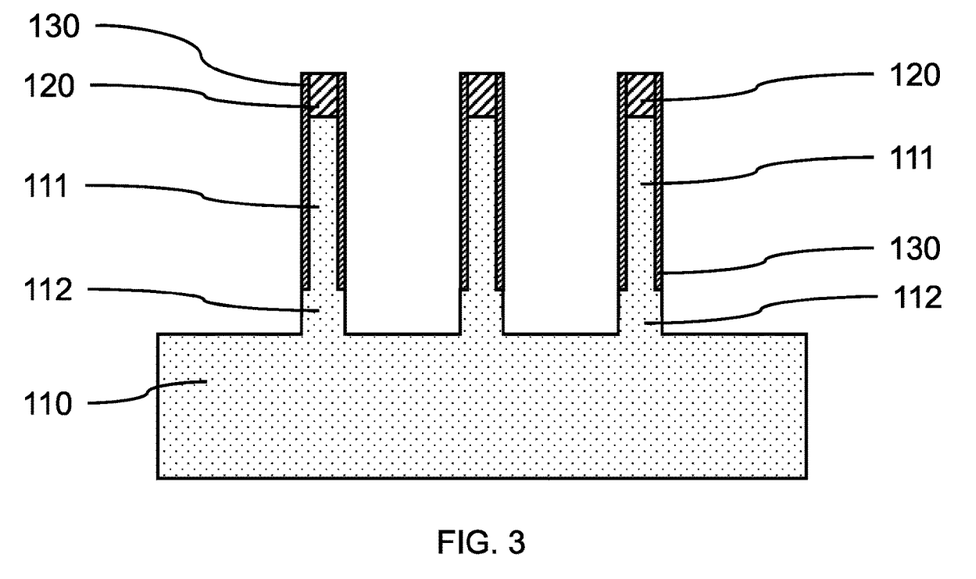
FIG. 3 is a cross-sectional side view showing the substrate adjacent to the plurality of vertical fins recessed, in accordance with an embodiment of the present invention.

FIG. 3 is a cross-sectional side view showing the substrate adjacent to the plurality of vertical fins recessed, in accordance with an embodiment of the present invention.

In various embodiments, the protective layer 130 can have a thickness in a range of about 1 nm to about 10 nm, or about 2 nm to about 5 nm, although other thicknesses are also contemplated.

In one or more embodiments, portions of the protective layer 130 can be removed using a selective, directional etch, for example, a reactive ion etch (RIE) that can leave portions of the protective layer 130 on the sidewalls and end walls of the vertical fins 111, while portions of the protective layer 130 can be removed from the surface of the substrate 110 and fin templates 130. Portions of the substrate 110 can be exposed by removal of the portion of the protective layer 130.

In various embodiments, the substrate 110 adjacent to the plurality of vertical fins can be recessed using a selective, directional etch (e.g., RIE). Recessing the substrate can form a supporting pillar 112 below each of the vertical fins 111, where the supporting pillar 112 can have a width and length greater than the overlying vertical fin of about two times (2×) the thickness of the protective layer 130. In various embodiments, the thickness of the protective layer 130 can be the minimum thickness needed to protect the vertical fins 111 from damage and etching during recessing of the substrate 110, to maintain the supporting pillar 112 width and length as close as possible to the vertical fins 111. A supporting pillar 112 can also be formed under vertical nanowire and vertical pillar structures.

In various embodiments, a lateral etch can be performed to reduce the width and length of the supporting pillar(s) 112, where the thinned supporting pillar(s) 112 can have the same width as the overlying vertical fin(s) 111 or a width less than the width of the overlying vertical fin(s) 111.

In various embodiments, the substrate 110 can be recessed to a depth in a range of about 10 nm to about 40 nm, or about 20 nm to about 30 nm from the initial bottom of the vertical fin(s) 111. The depth can be predetermined by an intended thickness of a subsequently formed bottom source/drain layer.

Figure 4:
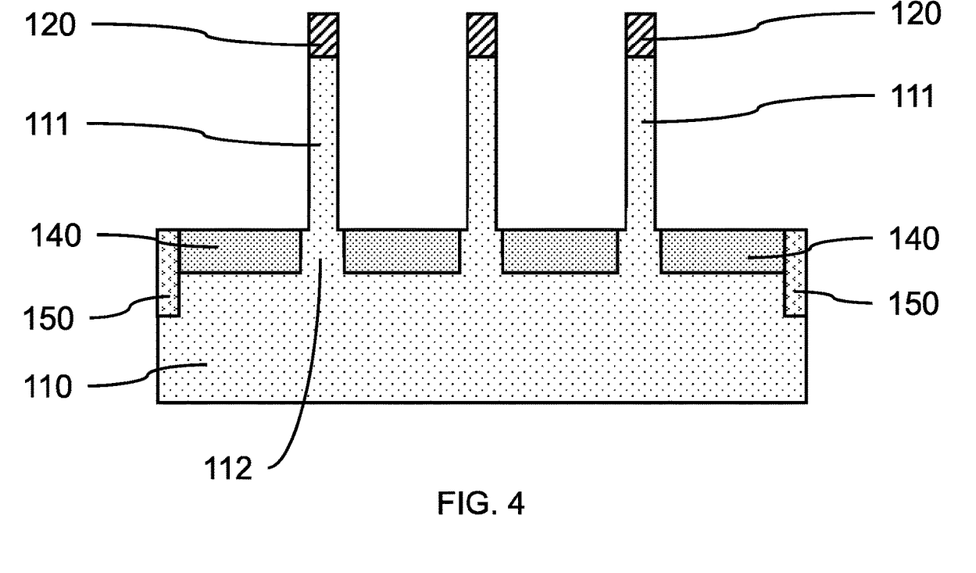
FIG. 4 is a cross-sectional side view showing a bottom source/drain layer formed in the recesses adjacent to the plurality of vertical fins, and isolation regions formed in the bottom source/drain layer and substrate, in accordance with an embodiment of the present invention.

FIG. 4 is a cross-sectional side view showing a bottom source/drain layer formed in the recesses adjacent to the plurality of vertical fins, and isolation regions formed in the bottom source/drain layer and substrate, in accordance with an embodiment of the present invention.

In one or more embodiments, a bottom source/drain layer 140 can be formed on the surface of the substrate 110 and sidewalls of the supporting pillars 112 formed by recessing the substrate around the vertical fins 111. The bottom source/drain layer 140 can be formed by epitaxial or heteroepitaxial growth on a crystalline surface of the substrate 110 and/or supporting pillars 112. The bottom source/drain layer 140 can be a semiconductor material (e.g., Si, SiC, SiGe, Ge, etc.) having the same crystal structure and orientation as the underlying substrate 110. The bottom source/drain layer 140 can be suitably doped to form an n-type or p-type bottom source/drain.

In various embodiments, the bottom source/drain layer 140 can have a dopant concentration in the range of about $1 \times 10^{20}/cm^3$ to about $3 \times 10^{21}/cm^3$, or about $5 \times 10^{20}/cm^3$ to about $1 \times 10^{21}/cm^3$, although other concentrations are contemplated.

In various embodiments, the bottom source/drain layer 140 can be formed by epitaxially growing the bottom source/drain layer 140 on the substrate, growing a semiconductor layer on top of the bottom source/drain layer 140, then performing a patterning technique to form the vertical fins 111 and bottom source/drain(s), where the doped bottom source/drain layer 140 can be formed before forming the vertical fins 111 from the semiconductor layer.

In various embodiments, the bottom source/drain layer 140 can be a semiconductor material, including, but not limited to n-type (e.g., P or As) doped silicon (Si) or p-type (e.g., B) doped silicon-germanium (SiGe).

In one or more embodiments, the vertical fins 111, fin templates 120, and bottom source/drain layer 140 can be masked and patterned to expose portions of the bottom source/drain layer 140 using lithographic techniques. The exposed portion(s) of the bottom source/drain layer 140 and underlying portion(s) of the substrate 110 can be removed to form isolation region trenches. The isolation region trenches can be filled with a dielectric material, including, but not limited to, silicon oxide (SiO), silicon nitride (SiN), or a low-k dielectric material to form isolation regions 150 in the bottom source/drain layer 140 and substrate. A low-k dielectric material can include, but not be limited to, silicon oxynitride (SiON), silicon-carbon-nitride (SiCN), boron nitride (BN), silicon boron nitride (SiBN), silicon boron carbonitride (SiBCN), silicon oxycabonitride (SiOCN), carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof. The dielectric material can be formed by a blanket deposition, for example, chemical vapor deposition (CVD), or spin-on, and etched back to form the isolation regions 150 in the isolation trenches.

In various embodiments, the remaining portions of the protective layer 130 can be removed using a selective isotropic etch, for example, a wet chemical etch or dry plasma etch, after forming the bottom source/drain layer 140. The remaining portions of the protective layer 130 can be removed before or after forming isolation regions 150.

Figure 5:
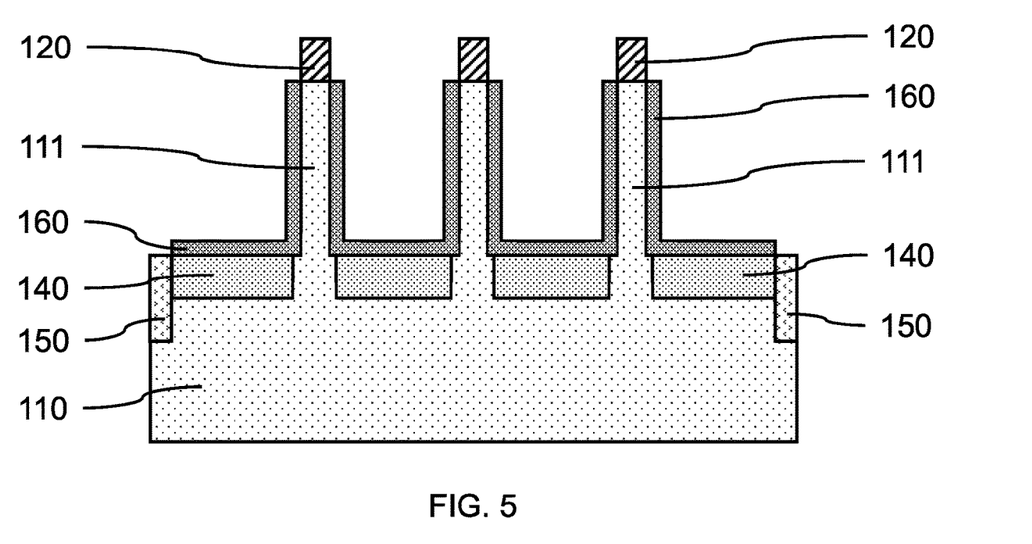
FIG. 5 is a cross-sectional side view showing a doped layer on the bottom source/drain layer and substrate, in accordance with an embodiment of the present invention.

FIG. 5 is a cross-sectional side view showing a doped layer on the bottom source/drain layer and substrate, in accordance with an embodiment of the present invention.

In one or more embodiments, a doped layer 160 can be formed on the bottom source/drain layer 140, supporting pillars 112, and sidewalls of the vertical fins 111, where the doped layer 160 can be formed by epitaxial or heteroepitaxial growth on a crystalline surface of the bottom source/drain layer 140 and/or sidewalls of the vertical fins 111 depending on the exposed crystal faces. The fin templates 120 can remain exposed after formation of the doped layer 160 by epitaxy or heteroepitaxy.

In various embodiments, the doped layer 160 can be a doped semiconductor material. The dopant can be an n-type dopant (e.g., phosphorus (P), arsenic (As)) or p-type dopant (e.g., boron (B), gallium (Ga)), for example, phosphorus-doped silicon (Si:P) for an n-type field effect transistor (FET) device or boron-doped silicon-germanium (SiGe) for a p-type FET device. The dopant can be introduced into the source/drains during formation (i.e., in situ) and/or after formation (i.e., ex situ), for example, through ion implantation, plasma doping, gas phase doping, solid phase doping, liquid phase doping. The doped layer can be selectively etchable relative to the adjoining layers.

In various embodiments, the dopant concentration of the doped layer 160 can be less than the dopant concentration of the bottom source/drain layer 140, where the doped layer 160 can be about one order of magnitude lower (10×) than the dopant concentration of the bottom source/drain layer 140. In various embodiments, the bottom source/drain layer 140 can have a dopant concentration in the range of about $5 \times 10^{18}/cm^3$ to about $3 \times 10^{20}/cm^3$, or $1 \times 10^{19}/cm^3$ to about $3 \times 10^{20}/cm^3$, or about $5 \times 10^{18}/cm^3$ to about $1 \times 10^{19}/cm^3$, although other concentrations are contemplated. In a non-limiting exemplary embodiment, the dopant concentration of the doped layer 160 can be one tenth (1/10) the dopant concentration of the bottom source/drain layer 140.

In various embodiments, the doped layer 160 can have a thickness in a range of about 1.5 nm to about 6 nm, or about 2 nm to about 3 nm, although other thicknesses are also contemplated.

In various embodiments, the doped layer 160 can be used to enable self-alignment of a gate structure to both a top and a bottom source/drain.

Figure 6:
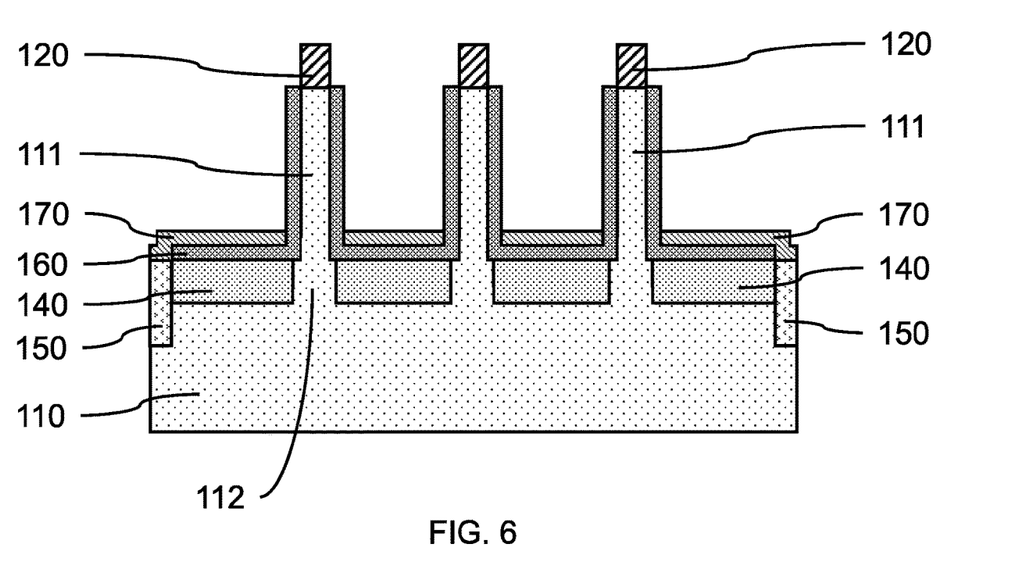
FIG. 6 is a cross-sectional side view showing a bottom spacer layer on the doped layer on the substrate, in accordance with an embodiment of the present invention.

FIG. 6 is a cross-sectional side view showing a bottom spacer layer on the doped layer on the substrate, in accordance with an embodiment of the present invention.

In one or more embodiments, a bottom spacer layer 170 can be formed on the exposed surface of the doped layer 160, where the bottom spacer layer 170 can be formed by a directional deposition, for example, a high density plasma (HDP) or gas cluster ion beam (GCIB), so the thickness of the bottom spacer layer 170 on the doped layer 160 is thicker than the bottom spacer layer 170 deposited on the vertical sidewalls of the doped layer 160. An isotropic etch can be used to remove the bottom spacer layer 170 deposited on the vertical sidewalls of the doped layer 160.

In various embodiments, the bottom spacer layer 170 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

Figure 7:
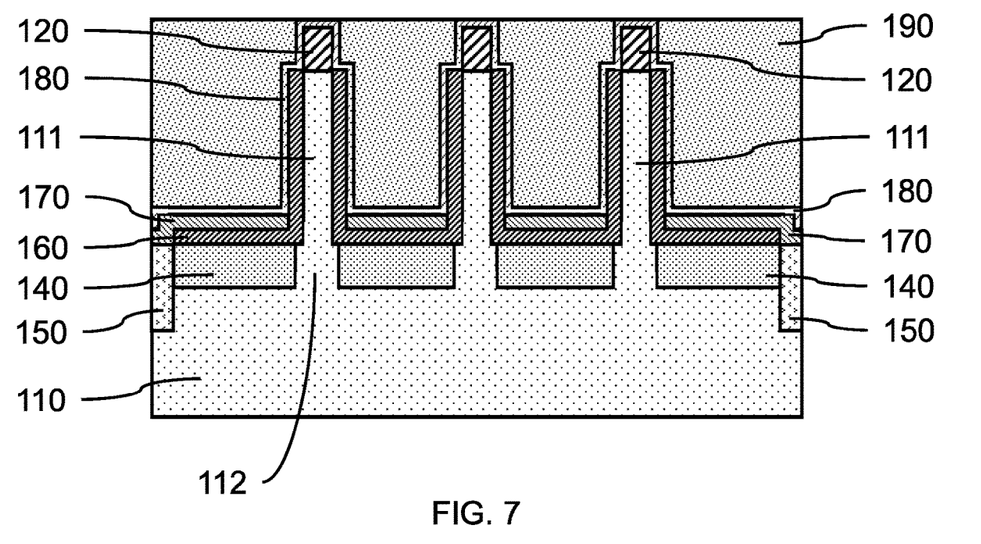
FIG. 7 is a cross-sectional side view showing a dummy gate fill and dummy gate liner on the bottom spacer layer and the doped layer, in accordance with an embodiment of the present invention.

FIG. 7 is a cross-sectional side view showing a dummy gate fill and dummy gate liner on the bottom spacer layer and the doped layer, in accordance with an embodiment of the present invention.

In one or more embodiments, a dummy gate liner 180 can be formed on the exposed surfaces of the bottom spacer layer 170, doped layer 160, and fin templates 120, where the dummy gate liner 180 can be formed by a conformal deposition (e.g., ALD, PEALD) or other deposition processes (e.g., chemical vapor deposition (CVD), plasma enhanced CVD (PECVD)). The dummy gate liner 180 can be a dielectric material can be selectively etched relative to the fin templates 120, bottom spacer layer 170 and the doped layer 160, for example, silicon oxide (SiO) or silicon oxynitride (SiON).

In one or more embodiments, a dummy gate fill 190 can be formed on the dummy gate liner 180, where the dummy gate fill 190 can be formed by a blanket deposition (e.g., CVD, spin-on). In various embodiments, the dummy gate fill 190 can be amorphous silicon (a-Si) or amorphous carbon (a-C) to allow selective removal of the material relative to the dummy gate liner. The dummy gate liner 180 and dummy gate fill 190 can form a dummy gate structure on the bottom spacer layer 170 and the doped layer 160.

Figure 8:
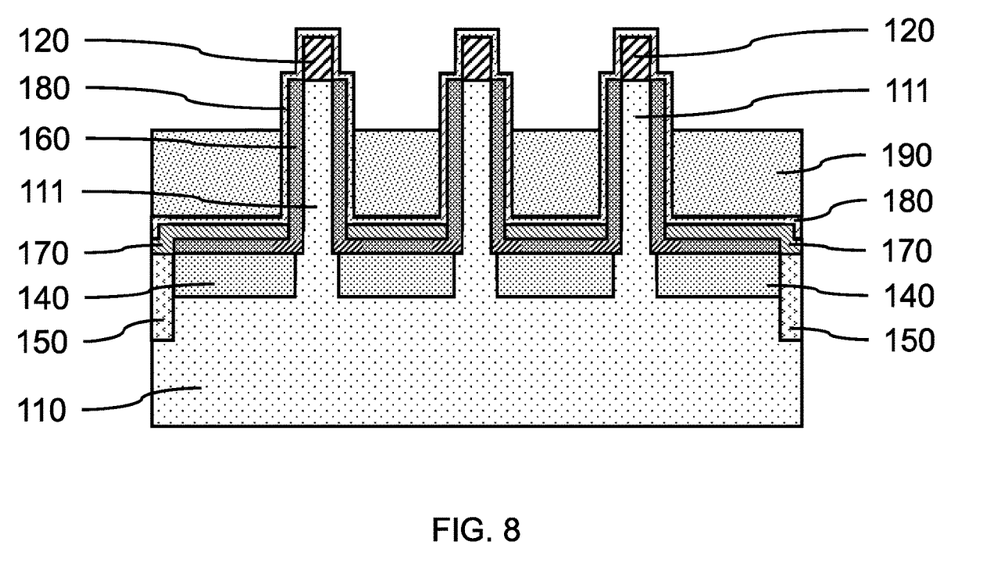
FIG. 8 is a cross-sectional side view showing the dummy gate fill recessed to expose a portion of the dummy gate liner on the doped layer, in accordance with an embodiment of the present invention.

FIG. 8 is a cross-sectional side view showing the dummy gate fill recessed to expose a portion of the dummy gate liner on the doped layer, in accordance with an embodiment of the present invention.

In one or more embodiments, the dummy gate fill 190 can be etched back using a selective directional etch (e.g., RIE) and/or an isotropic etch (e.g., wet chemical etch, dry plasma etch) to expose an upper portion of the dummy gate liner 180 on the vertical fins 111 and fin templates 120. The height of the remaining dummy gate fill 190 can determine a gate length on the vertical fins.

Figure 9:
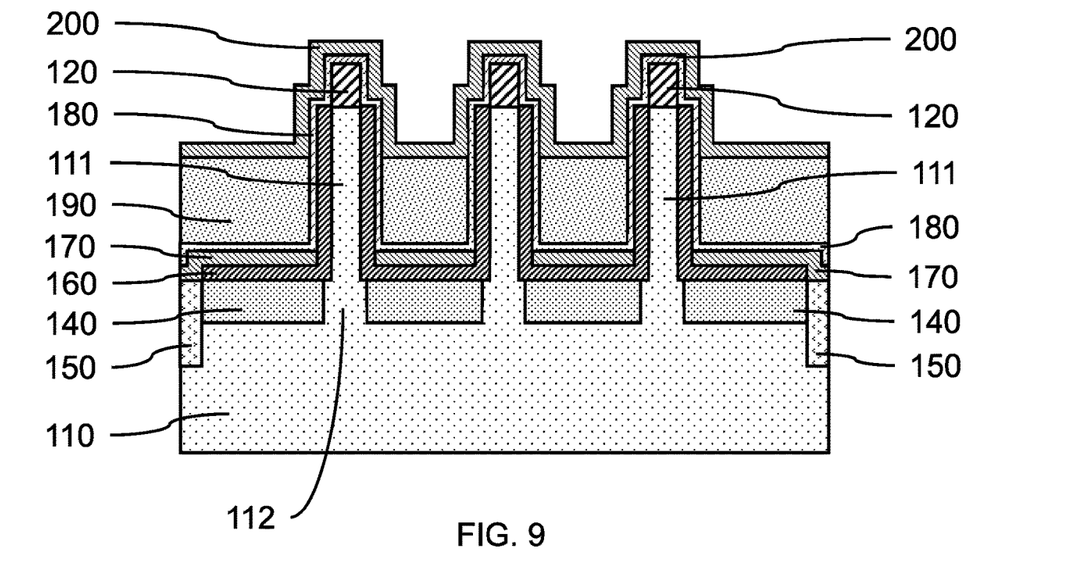
FIG. 9 is a cross-sectional side view showing a protective cap layer on the dummy gate fill and expose portions of the dummy gate liner and fin templates, in accordance with an embodiment of the present invention.

FIG. 9 is a cross-sectional side view showing a protective cap layer on the dummy gate fill and expose portions of the dummy gate liner and fin templates, in accordance with an embodiment of the present invention.

In one or more embodiments, a protective cap layer 200 can be formed on the dummy gate fill 190 and dummy gate liner 180, where the protective cap layer 200 can be formed by a conformal deposition (e.g., ALD, PEALD), or other deposition processes (e.g., CVD, PECVD), molecular layer deposition (MLD), and combinations thereof.

In various embodiments, the protective cap layer 200 can be a dielectric material that can be selectively etched relative to the dummy gate fill 190 and dummy gate liner 180. The protective cap layer 200 can be, for example, silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In various embodiments, the protective cap layer 200 can have a thickness in a range of about 2 nm to about 10 nm, or about 4 nm to about 6 nm, although other thicknesses are also contemplated.

Figure 10:
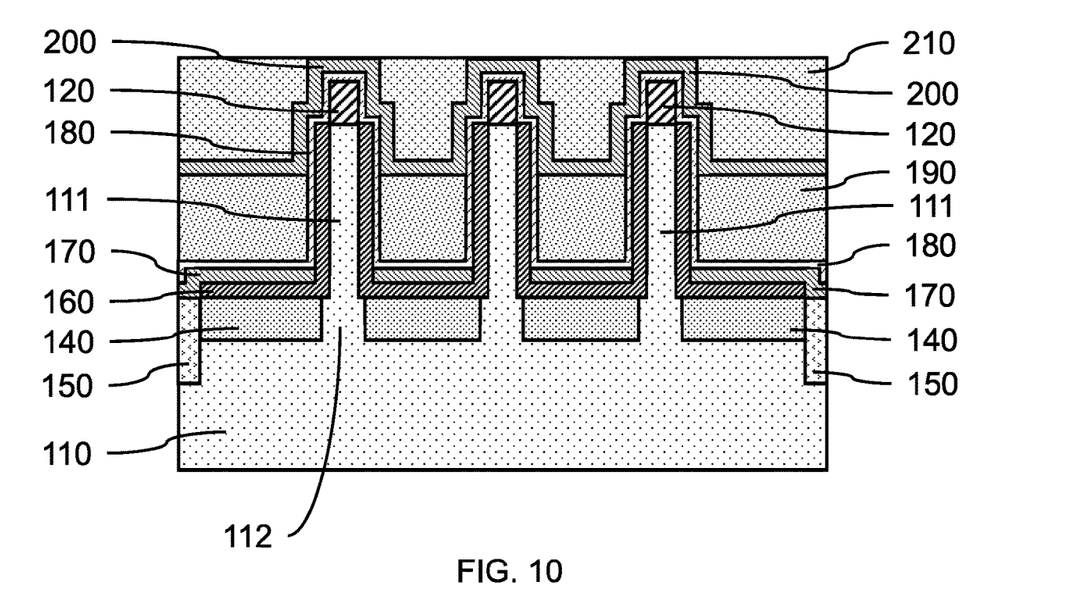
FIG. 10 is a cross-sectional side view showing a fill layer on the protective cap layer, in accordance with an embodiment of the present invention.

FIG. 10 is a cross-sectional side view showing a fill layer on the protective cap layer, in accordance with an embodiment of the present invention.

In one or more embodiments, a fill layer 210 can be formed on the protective cap layer 200, where the fill layer 210 can be formed by a blanket deposition. The fill layer 210 can be silicon oxide (SiO), silicon nitride (SiN), a low-k dielectric material, or combinations thereof. In various embodiments, portions of the fill layer 210 can be removed using a chemical-mechanical polishing (CMP) to expose a top surface of the protective cap layer 200 on the fin template(s) 120.

Figure 11:
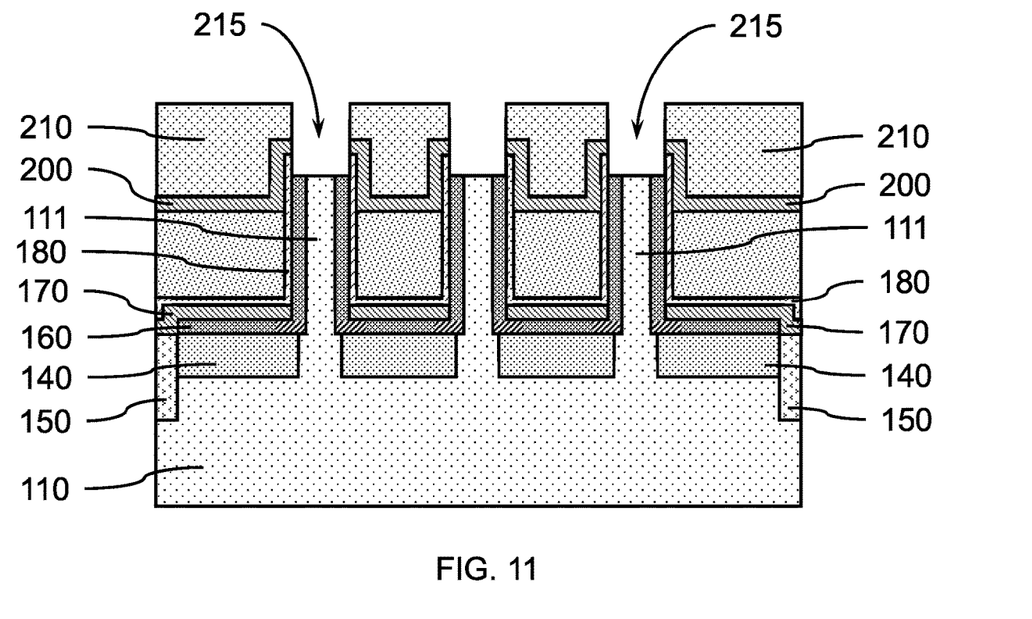
FIG. 11 is a cross-sectional side view showing portions of the fill layer, protective cap layer, and fin templates removed to form channels that expose the dummy gate liner, doped layer, and a top surface of the vertical fins, in accordance with an embodiment of the present invention.

FIG. 11 is a cross-sectional side view showing portions of the fill layer, protective cap layer, and fin templates removed to form channels that expose the dummy gate liner, doped layer, and a top surface of the vertical fins, in accordance with an embodiment of the present invention.

In one or more embodiments, a portion of the protective cap layer 200 on the fin template(s) 120 can be removed using a selective etch to expose the underlying dummy gate liner 180. The exposed portion of the dummy gate liner 180 can be removed using a selective etch to expose the fin template(s) 120. The fin template(s) 120 can be removed using a selective etch to expose the top surfaces of the vertical fins 111. Removal of the portion of the protective cap layer 200, dummy gate liner 180, and fin template(s) 120 can form a channel 215 in the fill layer 210.

Figure 12:
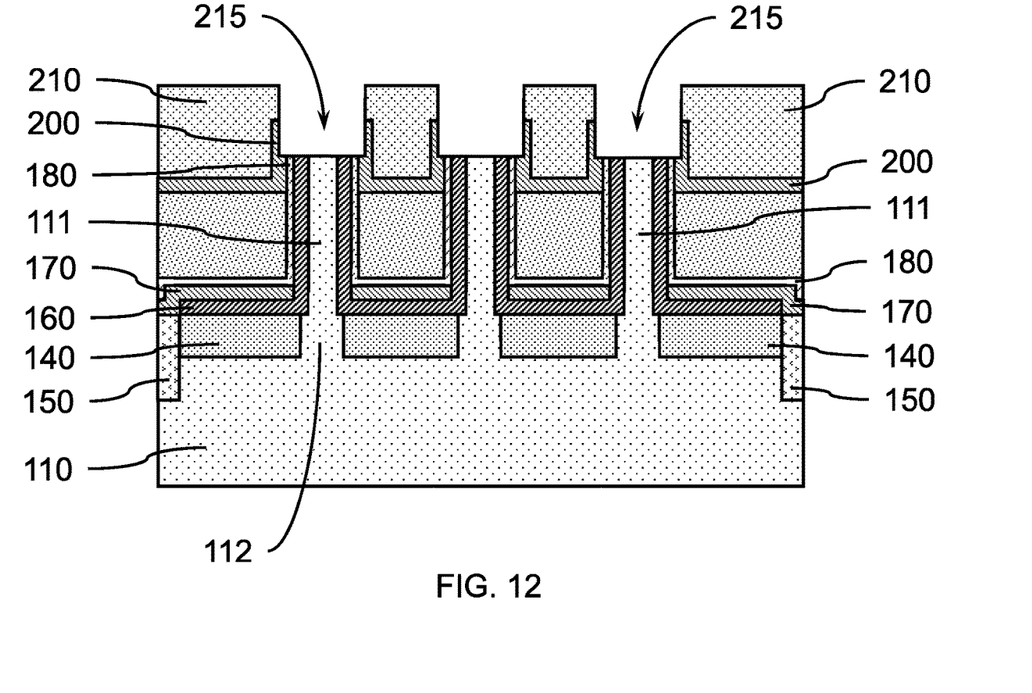
FIG. 12 is a cross-sectional side view showing enlarged channels from removing additional portions of the dummy gate liner, fill layer, and protective cap layer, in accordance with an embodiment of the present invention.

FIG. 12 is a cross-sectional side view showing enlarged channels from removing additional portions of the dummy gate liner, fill layer, and protective cap layer, in accordance with an embodiment of the present invention.

In various embodiments, the channel(s) 215 can be enlarged by removing additional portions of the dummy gate liner, fill layer, and protective cap layer using an isotropic etch. A portion of the protective cap layer 200 can remain to form a sidewall of the enlarged channel(s) 215.

Figure 13:
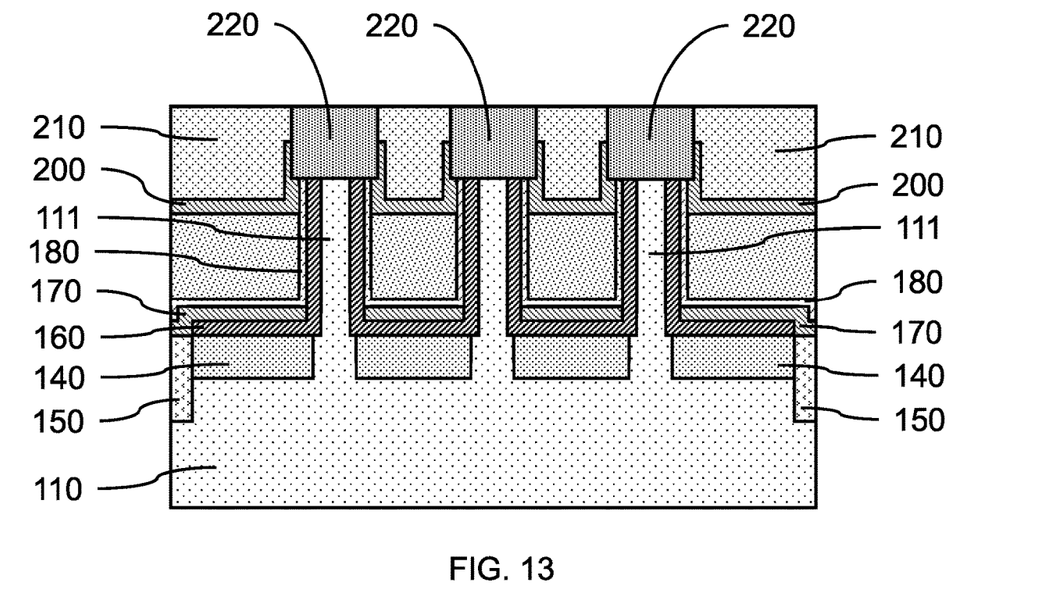
FIG. 13 is a cross-sectional side view showing top source/drains formed in the enlarged channels on the top surface of the vertical fins, in accordance with an embodiment of the present invention.

FIG. 13 is a cross-sectional side view showing top source/drains formed in the enlarged channels on the top surface of the vertical fins, in accordance with an embodiment of the present invention.

In one or more embodiments, a top source/drain 220 can be formed in each of the enlarged channels 215 on the exposed top surface of the vertical fins 111. The top source/drain(s) 220 can be formed by epitaxial or heteroepitaxial growth on the crystalline surface of the vertical fins 111. The top source/drains 220 can be suitably doped to form an n-type or p-type top source/drain 220. The top source/drain(s) can be doped using the same dopant species or same dopant type as the bottom source/drain layer 140.

Figure 14:
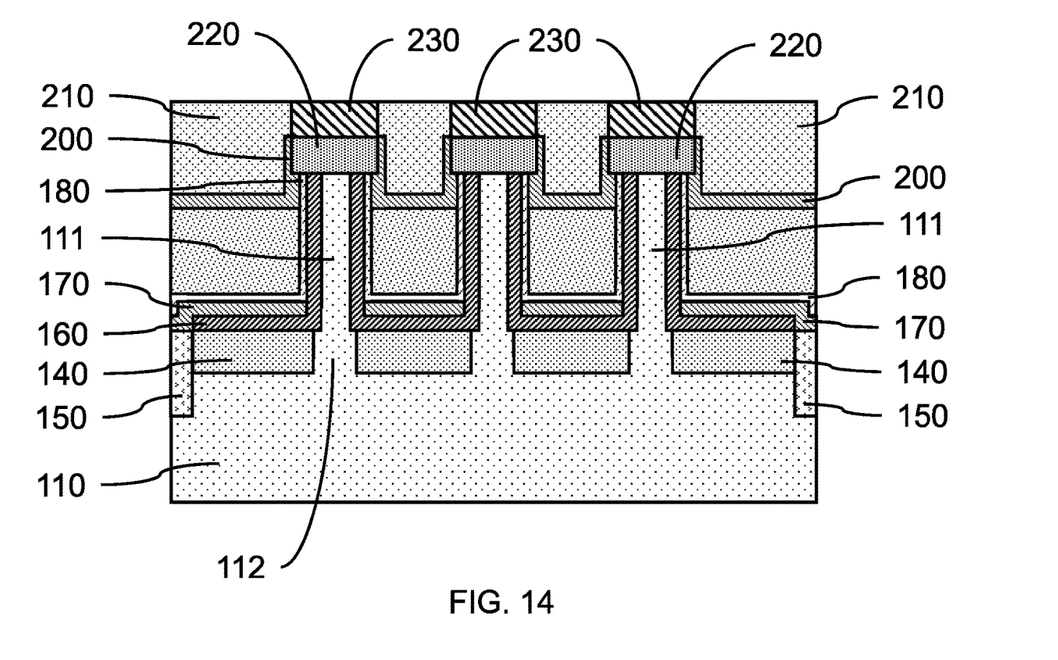
FIG. 14 is a cross-sectional side view showing top source/drain caps formed on the top source/drains after removing a portion of the top source/drains, in accordance with an embodiment of the present invention.

FIG. 14 is a cross-sectional side view showing top source/drain caps formed on the top source/drains after removing a portion of the top source/drains, in accordance with an embodiment of the present invention.

In one or more embodiments, a portion of the top source/drain(s) 220 can be removed to form a space in the enlarged channel 215. A top source/drain cap 230 can be formed in the space to cover the remaining portion of the top source/drain 220, where the top source/drain cap 230 can be formed by a blanket deposition. A CMP can be used to remove excess material above the fill layer 210. In various embodiments, the top source/drain cap 230 can be a dielectric material, for example, silicon oxycarbide (SiOC) or carbon-doped silicon oxide (SiO:C).

Figure 15:
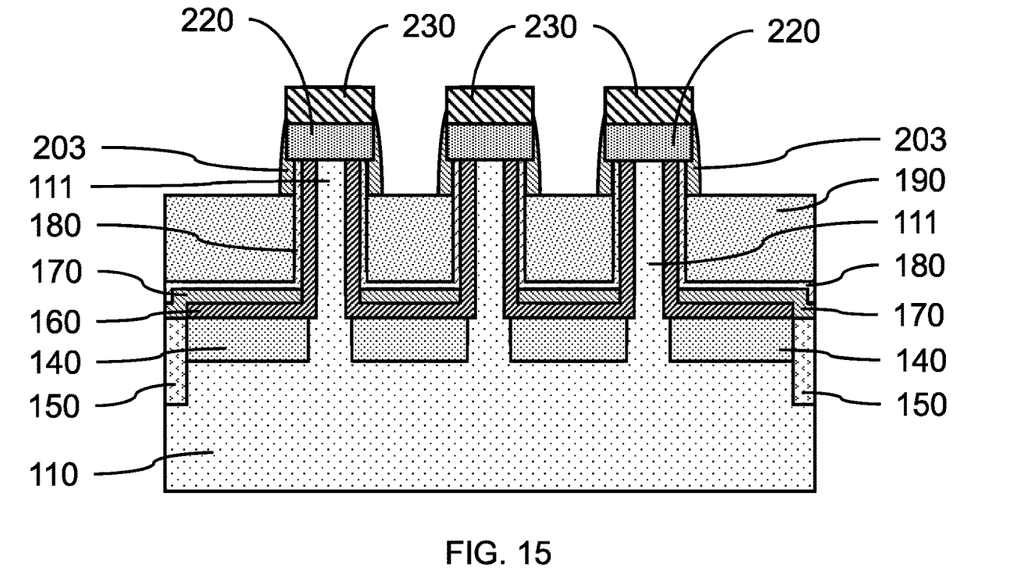
FIG. 15 is a cross-sectional side view showing the fill layer and portions of the protective cap layer removed from the dummy gate fill, in accordance with an embodiment of the present invention.

FIG. 15 is a cross-sectional side view showing the fill layer and portions of the protective cap layer removed from the dummy gate fill, in accordance with an embodiment of the present invention.

In various embodiments, the fill layer 210 and portions of the protective cap layer 200 can be removed from the dummy gate fill 190. In various embodiments, a selective isotropic etch can be used to remove the fill layer 210, whereas a selective, directional etch can be used to remove exposed portions of the protective cap layer 200 on the dummy gate fill 190, while leaving protective spacers 203 on the top source/drains 220 and portions of the dummy gate liner 180.

Figure 16:
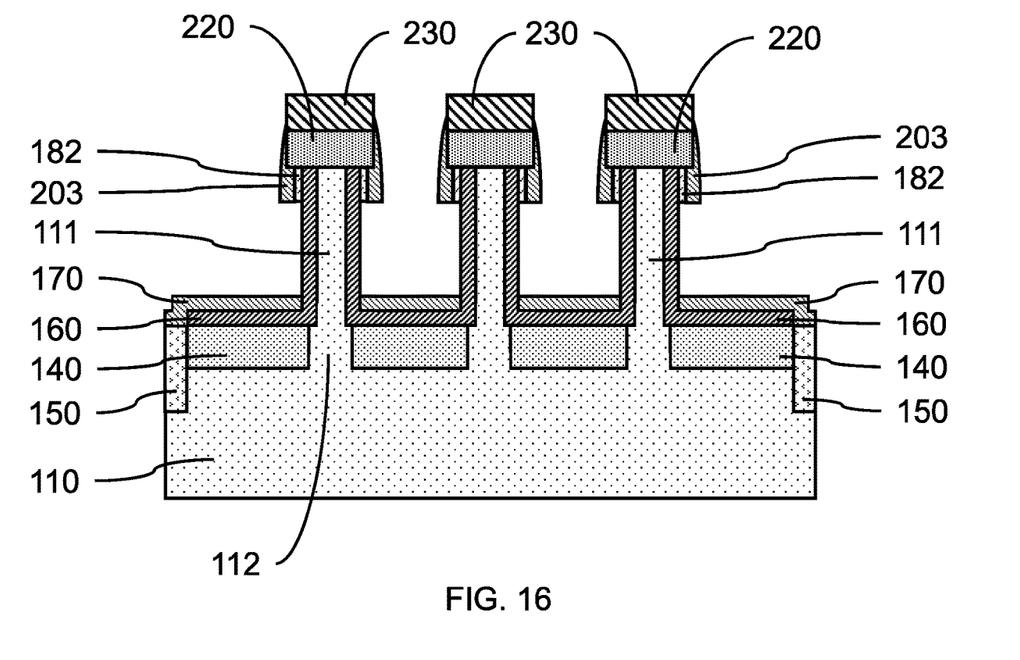
FIG. 16 is a cross-sectional side view showing the dummy gate fill and portions of the dummy gate liner removed from the bottom spacer layer and doped layer, in accordance with an embodiment of the present invention.

FIG. 16 is a cross-sectional side view showing the dummy gate fill and portions of the dummy gate liner removed from the bottom spacer layer and doped layer, in accordance with an embodiment of the present invention.

In one or more embodiments, the dummy gate fill 190 and portions of the dummy gate liner 180 can be removed from the bottom spacer layer 170 and doped layer 160. The dummy gate fill 190 can be removed using an isotropic etch to expose portions of the dummy gate liner 180. The exposed portions of the dummy gate liner 180 can be removed using an isotropic etch, while leaving dummy gate liner segments 182 between the protective spacers 203 and doped layer 160.

Figure 17:
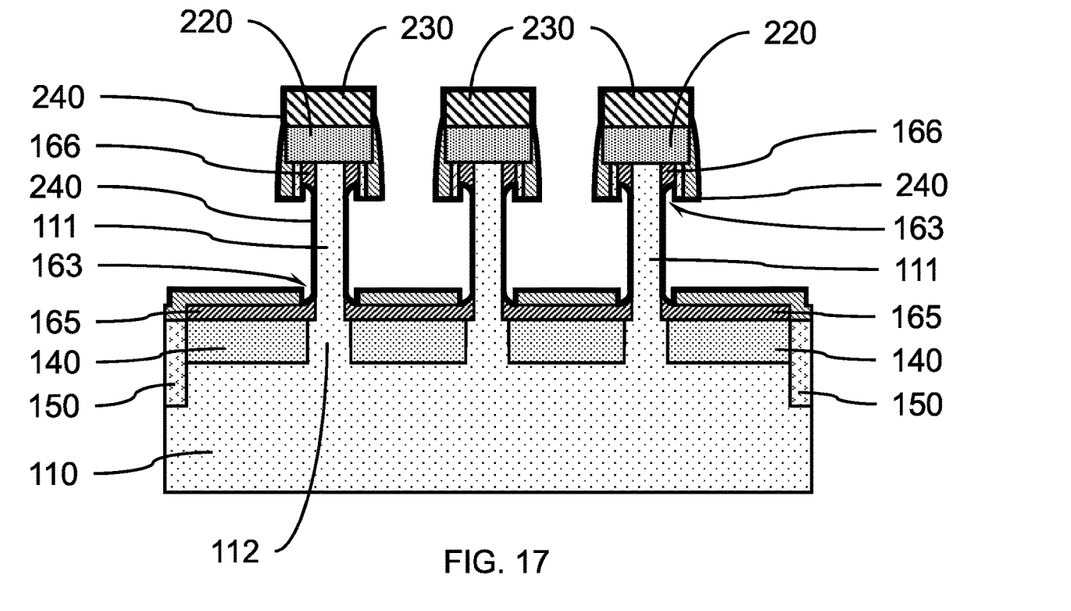
FIG. 17 is a cross-sectional side view showing a portion of the doped layer removed from the sidewalls of the vertical fins to form upper and lower cavities, an upper doped layer segment, and a lower doped layer segment, and a gate dielectric layer formed on the upper doped layer segment, lower doped layer segment, and sidewalls of the vertical fins, in accordance with an embodiment of the present invention.

FIG. 17 is a cross-sectional side view showing a portion of the doped layer removed from the sidewalls of the vertical fins to form upper and lower cavities, an upper doped layer segment, and a lower doped layer segment, and a gate dielectric layer formed on the upper doped layer segment, lower doped layer segment, and sidewalls of the vertical fins, in accordance with an embodiment of the present invention.

In various embodiments, a portion of the doped layer 160 can be removed from the sidewalls of the vertical fins 111 to form upper and lower cavities 163, where a central section of the vertical fin 111 can be exposed by removal of the portion of the doped layer 160. A portion of the doped layer 160 can remain adjacent to the dummy gate liner segments 182 to form an upper doped layer segment 166. A portion of the doped layer 160 can remain adjacent to the bottom spacer layer 170 to form a lower doped layer segment 165. In various embodiments, the upper and lower cavities 163 can have a cupped shape formed by an isotropic etch having a greater etching time on the more proximal surfaces than those of the doped layer 160 further in the cavities.

In one or more embodiments, a gate dielectric layer 240 can be formed on the exposed surfaces of the vertical fins 111, upper doped layer segment 166, lower doped layer segment 165, dummy gate liner segments 182, protective spacers 203, bottom spacer layer 170, and top source/drain cap 230. The gate dielectric layer 240 can be formed by a conformal deposition on the exposed surfaces.

In various embodiments, the gate dielectric layer 240 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 240 can have a thickness in a range of about 1 nm to about 3 nm, or about 2 nm, although other thicknesses are also contemplated.

Figure 18:
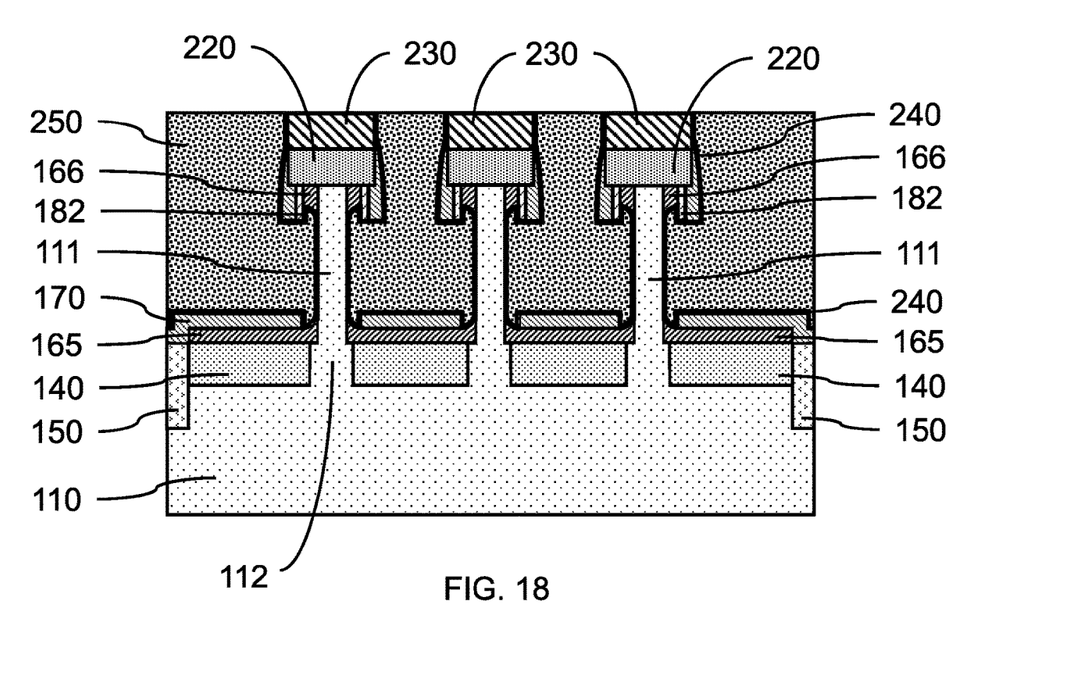
FIG. 18 is a cross-sectional side view showing a conductive gate fill on the gate dielectric layer, in accordance with an embodiment of the present invention.

FIG. 18 is a cross-sectional side view showing a conductive gate fill on the gate dielectric layer, in accordance with an embodiment of the present invention.

In one or more embodiments, a conductive gate fill 250 can be formed on the gate dielectric layer 240, where the conductive gate fill 250 can be formed by a blanket deposition.

In various embodiments, the conductive gate fill 250 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

Figure 19:
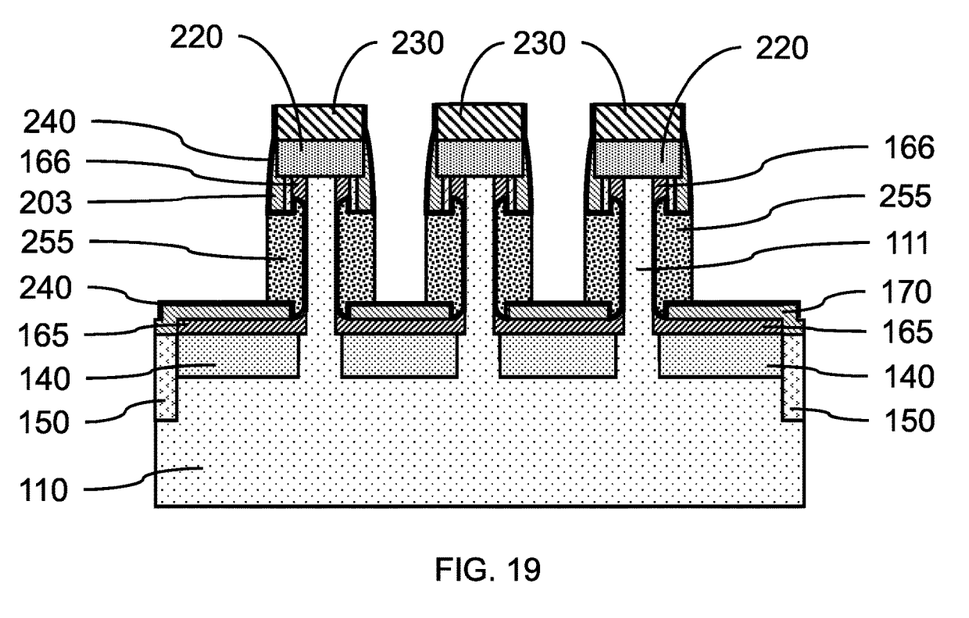
FIG. 19 is a cross-sectional side view showing a conductive gate electrode on the gate dielectric layer after removing portions of the conductive gate fill, in accordance with an embodiment of the present invention.

FIG. 19 is a cross-sectional side view showing a conductive gate electrode on the gate dielectric layer after removing portions of the conductive gate fill, in accordance with an embodiment of the present invention.

In various embodiments, portions of the conductive gate fill 250 can be removed using a selective, directional etch, where the protective spacers 203 and top source/drain cap 230 can mask the underlying portions of the conductive gate fill 250. The remaining portions of the conductive gate fill 250 can form conductive gate electrodes 255 on the gate dielectric layer 240, where the conductive gate electrodes 255 on the gate dielectric layer 240 form a gate structure for the FinFETs. The gate structures can have a mushroom cap shape where the conductive gate electrodes 255 fill in the curved upper and lower cavities 163.

Figure 20:
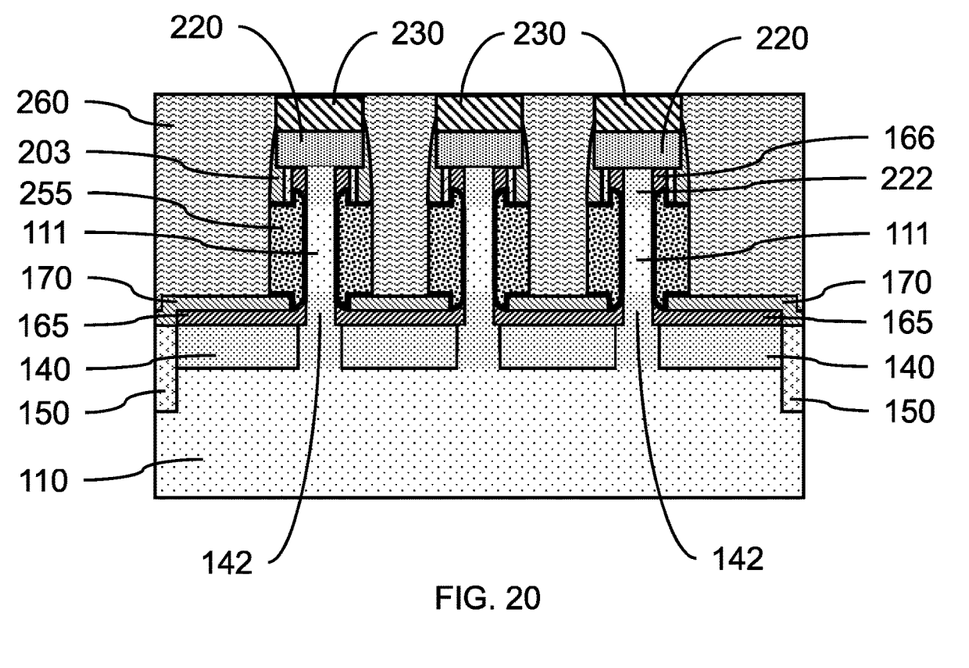
FIG. 20 is a cross-sectional side view showing an interlayer dielectric (ILD) layer on the conductive gate electrodes and protective cap spacers, in accordance with an embodiment of the present invention.

FIG. 20 is a cross-sectional side view showing an interlayer dielectric (ILD) layer on the conductive gate electrodes and protective cap spacers, in accordance with an embodiment of the present invention.

In one or more embodiments, an interlayer dielectric (ILD) layer 260 can be formed on the conductive gate electrodes 255 and protective cap spacers 203, where the ILD layer 260 can be formed by a blanket deposition, and portions of the ILD layer removed using CMP. The ILD layer 260 can be silicon oxide (SiO), a low-k dielectric material, or combinations thereof.

In one or more embodiments, a heat treatment can be used to diffuse dopants from the upper doped layer segment 166 and lower doped layer segment 165 into the adjacent vertical fin(s) 111 to form upper extension regions 222 and lower extension regions 142 in the vertical fins 111. The heat treatment can be a spike anneal to form an overlap junction with the conductive gate electrode in the upper and lower cavities 163.

In various embodiments, the heat treatment can be conducted at a temperature in the range of about 800° C. to about 1300° C., or about 950° C. to about 1050° C. The heat treatment can be conducted for a duration in a range of about 30 milliseconds (msec) to about 30 seconds (sec). The heat treatment can be laser annealing, flash annealing, rapid thermal annealing (RTA), furnace annealing, or any suitable combination thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended for as many items listed.

The terminology used herein is for the purpose of describing particular embodiments acrd is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, but do not preclude the presence or addition of one or more other features, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it will also be understood that when a layer is referred to as being "between" two layers, it can be the only layer between the two layers e intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor device, comprising:
    forming a plurality of vertical fins on a substrate;
    forming a bottom source/drain layer adjacent to the plurality of vertical fins;
    growing a doped layer on the bottom source/drain layer and sidewalls of the plurality of vertical fins;
    forming a dummy gate liner on the doped layer and the bottom source/drain layer;
    forming a dummy gate fill on the dummy gate liner;
    forming a protective cap layer on the dummy gate fill; and
    removing a portion of the protective cap layer to expose a top surface of the plurality of vertical fins.

2. The method of claim 1, further comprising forming a top source/drain on each of the plurality of vertical fins.

3. The method of claim 2, further comprising removing a portion of the protective cap layer to form protective spacers on each of the top source/drains.

4. The method of claim 3, further comprising removing the dummy gate fill and a portion of the dummy gate liner to expose portions of the doped layer on the sidewalls of the plurality of vertical fins.

5. The method of claim 4, further comprising removing a portion of the doped layer to form upper and lower cavities, and upper doped layer segments between the vertical fin and protective spacers.

6. The method of claim 5, wherein the upper and lower cavities are cup shaped.

7. The method of claim 5, further comprising forming a gate dielectric layer on the sidewalls of the plurality of vertical fins, and on the upper doped layer segments.

8. The method of claim 7, further comprising forming a conductive gate fill on the gate dielectric layer, and removing a portion of the conductive gate fill to form conductive gate electrodes below the protective spacers and upper doped layer segments.

9. The method of claim 8, further comprising forming a bottom spacer layer on the doped layer.

10. A method of forming a fin field effect transistor device, comprising:
    growing a doped layer on a bottom source/drain layer and sidewalls of a vertical fin on a substrate;
    forming a bottom spacer layer on a portion of the doped layer;
    forming a dummy gate liner on the bottom spacer layer and the doped layer;
    forming a dummy gate fill on the dummy gate liner;
    forming a protective cap layer on the dummy gate fill;
    removing a portion of the protective cap layer to expose a top surface of the vertical fin; and
    removing a portion of the protective cap layer to form a protective spacer.

11. The method of claim 10, further comprising removing the dummy gate fill and a portion of the dummy gate liner to expose portions of the doped layer on the sidewalls of the vertical fin.

12. The method of claim 11, further comprising removing a portion of the doped layer to form upper and lower cavities, and upper doped layer segments between the vertical fin and protective spacers.

13. The method of claim 12, wherein the upper and lower cavities are cup shaped.

14. The method of claim 12, further comprising forming a gate dielectric layer on the sidewalls of the plurality of vertical fins, and on the upper doped layer segments.

* * * * *